(12) United States Patent
Palmer

(10) Patent No.: US 11,175,837 B2
(45) Date of Patent: Nov. 16, 2021

(54) QUANTIZATION OF PEAK POWER FOR ALLOCATION TO MEMORY DICE

(71) Applicant: Micron Technology, Inc., Boise, ID (US)

(72) Inventor: David A. Palmer, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/820,478

(22) Filed: Mar. 16, 2020

(65) Prior Publication Data

US 2021/0286532 A1  Sep. 16, 2021

(51) Int. Cl.
| G06F 1/26 | (2006.01) |
| G06F 3/06 | (2006.01) |
| G06F 1/3225 | (2019.01) |
| G06F 1/3203 | (2019.01) |

(52) U.S. Cl.
CPC .......... *G06F 3/0625* (2013.01); *G06F 1/3225* (2013.01); *G06F 3/0617* (2013.01); *G06F 3/0653* (2013.01); *G06F 3/0683* (2013.01); *G06F 1/3203* (2013.01)

(58) Field of Classification Search
CPC .... G06F 3/0625; G06F 3/0653; G06F 3/0617; G06F 1/3225; G06F 3/0683
USPC ........................................................ 713/300
See application file for complete search history.

(56) References Cited

U.S. PATENT DOCUMENTS

| 6,507,530 | B1 | 1/2003 | Williams et al. |
| 9,417,685 | B2 | 8/2016 | Ha et al. |
| 2002/0040416 | A1 | 4/2002 | Tsern et al. |
| 2003/0182588 | A1 | 9/2003 | Dodd et al. |
| 2003/0206476 | A1 | 11/2003 | Joo |
| 2004/0006659 | A1 | 1/2004 | Lee |
| 2004/0260957 | A1 | 12/2004 | Jeddeloh et al. |
| 2006/0152966 | A1 | 7/2006 | Park |
| 2007/0011421 | A1 | 1/2007 | Keller et al. |
| 2007/0288783 | A1 | 12/2007 | Ogasawara et al. |
| 2008/0098277 | A1 | 4/2008 | Hazelzet |

(Continued)

FOREIGN PATENT DOCUMENTS

| CN | 101986241 A | 3/2011 |
| KR | 10-2015-0121537 A | 10/2015 |

OTHER PUBLICATIONS

International Search Report and Written Opinion, PCT App. No. PCT/US2020/040541, dated Oct. 26, 2020, 10 pages.

(Continued)

*Primary Examiner* — Volvick Derose
(74) *Attorney, Agent, or Firm* — Nicholson De Vos Webster & Elliott LLP

(57) ABSTRACT

A method for managing power amongst a set of memory devices that are provided a peak power that is quantized into a set number of power tokens. The method includes determining that the first memory die is to change from a lower power state that requires a first number of tokens to a higher power state that requires a second number of tokens. The method further includes transmitting a message in response to determining that the sum of the second number and a third number of power tokens allocated to other memory devices in the set of memory devices satisfies a threshold number of power tokens. The message includes the second number and is transmitted on a bus that is shared by the set of memory devices.

20 Claims, 10 Drawing Sheets

(56) References Cited

U.S. PATENT DOCUMENTS

| | | |
|---|---|---|
| 2008/0263373 A1 | 10/2008 | Meier et al. |
| 2009/0070612 A1 | 3/2009 | Adelman et al. |
| 2009/0089602 A1* | 4/2009 | Bose .................. G06F 1/206 713/340 |
| 2009/0219767 A1 | 9/2009 | Lines et al. |
| 2009/0300397 A1 | 12/2009 | Nguyen et al. |
| 2010/0191900 A1* | 7/2010 | Park ................ G06F 12/0246 711/103 |
| 2010/0191997 A1* | 7/2010 | Dodeja ............... G06F 1/3225 713/323 |
| 2010/0271092 A1* | 10/2010 | Zerbe ................... G06F 1/04 327/161 |
| 2011/0001358 A1* | 1/2011 | Conroy .............. G06F 1/3296 307/38 |
| 2013/0073886 A1 | 3/2013 | Zaarur |
| 2013/0170067 A1 | 7/2013 | Carter et al. |
| 2013/0326185 A1 | 12/2013 | Loh et al. |
| 2014/0067139 A1* | 3/2014 | Berke .................. G06F 1/26 700/291 |
| 2014/0112079 A1* | 4/2014 | Wakrat ................ G06F 1/26 365/185.18 |
| 2014/0136858 A1 | 5/2014 | Jacobson et al. |
| 2016/0077961 A1* | 3/2016 | Erez ................... G06F 1/3275 711/103 |
| 2016/0320980 A1* | 11/2016 | Fang .................. G06F 3/0631 |
| 2018/0143772 A1 | 5/2018 | Reusswig et al. |
| 2018/0188798 A1 | 7/2018 | Schmidt et al. |
| 2018/0285732 A1 | 10/2018 | Kurian et al. |
| 2019/0073139 A1 | 3/2019 | Kim et al. |
| 2019/0130984 A1* | 5/2019 | Jean .................... G11C 16/10 |
| 2019/0212932 A1* | 7/2019 | Lee ...................... G06F 1/28 |
| 2019/0235774 A1* | 8/2019 | Benisty ............... G06F 1/3275 |
| 2020/0104062 A1* | 4/2020 | Cho ................... G06F 3/0659 |
| 2020/0356153 A1* | 11/2020 | Kim .................... G06F 3/0625 |
| 2021/0011538 A1* | 1/2021 | Parry ................. G06F 1/3275 |

OTHER PUBLICATIONS

International Search Report and Written Opinion, PCT App. No. PCT/US2020/041016, dated Oct. 26, 2020, 10 pages.

Non-Final Office Action, U.S. Appl. No. 16/510,696, dated Nov. 25, 2020, 25 pages.

Notice of Allowance, U.S. Appl. No. 16/510,696, dated Apr. 29, 2021, 5 pages.

Notice of Allowance, U.S. Appl. No. 16/510,696, dated Mar. 18, 2021, 5 pages.

Notice of Allowance, U.S. Appl. No. 16/510,696, dated Mar. 30, 2021, 6 pages.

International Search Report and Written Opinion, PCT App. No. PCT/US2021/018843, dated Jun. 11, 2021, 10 pages.

* cited by examiner

MEMORY OPERATION 302A

| POWER STATE 304 | TIME PERIOD 306 | NUM. OF TOKENS 308 |
|---|---|---|
| $A_0$ | 3 us | 4 |
| $A_1$ | 5 us | 2 |
| $A_2$ | 2 us | 1 |
| $A_3$ | 1 us | 4 |

$304A_0$, $304A_1$, $304A_2$, $304A_3$

MEMORY OPERATION 302B

| POWER STATE 304 | TIME PERIOD 306 | NUM. OF TOKENS 308 |
|---|---|---|
| $B_0$ | 6 us | 3 |
| $B_1$ | 2 us | 2 |
| $B_2$ | 6 us | 1 |

POWER TOKEN TRACKING TABLE 600

| MEMORY DIE IDENTIFIER 602 | NUMBER OF POWER TOKENS 604 | TIME SLICE 606 |
|---|---|---|
| A | 1 | 1 |
| B | 12 | 2 |
| C | 9 | 3 |
| D | 8 | 4 |

FIG. 6

| POWER TOKEN TRACKING TABLE 600 | | |
|---|---|---|
| MEMORY DIE IDENTIFIER 602 | NUMBER OF POWER TOKENS 604 | TIME SLICE 606 |
| A | 1 | 1 |
| B | 8 | 2 |
| C | 9 | 3 |
| D | 7 | 4 |

| POWER TOKEN TRACKING TABLE 600 | | |
|---|---|---|
| MEMORY DIE IDENTIFIER 602 | NUMBER OF POWER TOKENS 604 | TIME SLICE 606 |
| A | 4 | 1 |
| B | 8 | 2 |
| C | 9 | 3 |
| D | 7 | 4 |

QUANTIZATION OF PEAK POWER FOR ALLOCATION TO MEMORY DICE

TECHNICAL FIELD

The present disclosure generally relates to power management, and more specifically, relates to quantization of peak power for allocation to memory dice.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 shows a set of power states for a first memory operation and a set of power states for a second memory operation, in accordance with some embodiments of the present disclosure.

FIG. 6 shows a power token tracking table with thirty power tokens allocated to a set of memory dice, in accordance with some embodiments of the present disclosure.

FIG. 7 shows a power token tracking table with twenty-five power tokens allocated to the set of memory dice, in accordance with some embodiments of the present disclosure.

FIG. 8 shows a power token tracking table with twenty-eight power tokens allocated to the set of memory dice, in accordance with some embodiments of the present disclosure.

DETAILED DESCRIPTION

Figure 1:
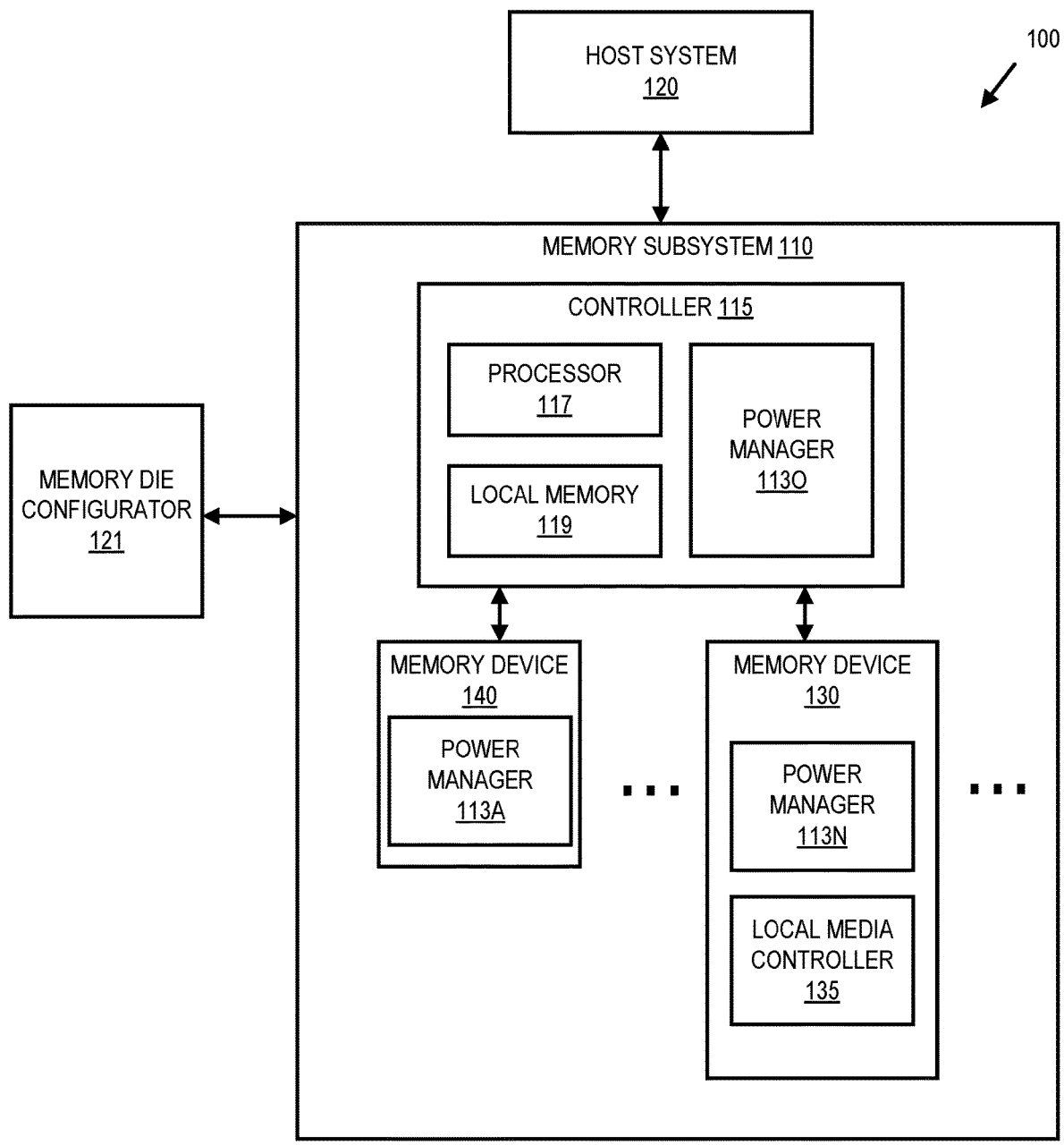
FIG. 1 illustrates an example computing system that includes a memory subsystem in accordance with some embodiments of the present disclosure.

Aspects of the present disclosure are directed to quantization of peak power for allocation to memory dice in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The memory devices can include, for example, non-volatile memory devices (e.g., NAND). Other types of memory devices, including volatile memory devices, are described in greater detail below in conjunction with FIG. 1. The host system can provide data to be stored at the memory subsystem and can request data to be retrieved from the memory subsystem.

Memory subsystems are often installed in devices with limited power resources. For example, a memory subsystem could be installed in a mobile device (e.g., a telephone, a tablet computer, a laptop computer, etc.) that primarily relies on a battery for power. In particular, the battery offers a set of memory dice of the memory subsystem a limited amount of power or current (referred to hereinafter as power) for performing a diverse set of operations that each have different power requirements. For example, a battery could provide 775 milliamperes (mA) of peak power that is relied upon by a set of memory dice of a memory subsystem for performing read/sense operations, write/program operations, erase operations, and other similar operations. Each of the operations performed by the set of memory dice can involve multiple phases with corresponding power requirements. In particular, each memory operation can be viewed as an algorithm with a set of sub-operations and groups of sub-operations in the algorithm correspond to different phases with associated power requirements. Thus, a memory die can have fluctuating power requirements even during the performance of a single operation. Since each memory die can have fluctuating power requirements over time, without proper management, the set of memory dice could require more power than offered by the peak power of a power source of the memory subsystem. Accordingly, the memory subsystem must intelligently manage the limited power offered to the set of memory dice to ensure the set of memory dice can continually operate and without the need to abort operations as a result of lack of power.

In conventional memory subsystems, the set of memory dice can perform a two-round technique to manage power allocation between the memory dice. In this two-round technique, each memory die reports their current power consumption/allocation as either a high-power state or a low power state. During a second round, which immediately follows the first round, memory dice can select and report a new power state (e.g., a high-power state) if there is sufficient room to make such a change. For example, the memory subsystem could only allow two memory dice to operate in a high-power state (i.e., two memory dice can be active). However, this two-round technique is inefficient as it (1) requires two rounds, where each memory die is forced to transmit information at least once before any memory die can change power state, (2) offers only two power states to select between (e.g., a high-power state and a low-power state), and (3) allocation budget is limited to the number of memory dice (e.g., only two memory dice can be in a high-power state).

Aspects of the present disclosure address the above and other deficiencies by quantizing the peak power provided by a power source of a memory subsystem into a set of power tokens that each represent an amount of power of the memory subsystem. In particular, the peak power available to the memory subsystem, including a set of memory dice, is divided/quantized into a set of power tokens based on (1) power waveforms of the set of memory dice for performance of a set of memory operations and/or (2) a set of policies. For example, a peak power available to a memory subsystem can be 775 mA and this peak power can be quantized into thirty-one power tokens that each represent 25 mA. In this configuration, each memory die of the memory subsystem (1) reports their current power allocation during an allocated time slice on a shared bus (i.e., a current number of allocated power tokens corresponding to a power stage of the memory die) and (2) tracks the power allocation of each other memory die based on reports from the other memory dice on the shared bus. Accordingly, during an allocated time slice of a memory die, if the memory die requires additional power to perform a memory operation (i.e., the memory die requires more power tokens in addition to the power tokens already allocated to the memory die), the memory die determines whether the peak power available to the memory subsystem can accommodate this additional demand in view of the allocations of power tokens to all the memory dice. When power is available for allocation (i.e., power tokens are available), the memory die reports a higher power allocation on the shared bus during their allocated time slice. However, when power is not available for allocation, the memory die can delay performance until another memory die reports the release of power tokens on the shared bus. In this fashion, memory dice report their consumption only during their time slice and a two-round system, as described above, is not needed. Further, since the memory subsystem allocates power based on power tokens, memory dice can contend for power at varying granularities.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access the memory components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative- and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem).

In general, the memory subsystem controller 115 can receive commands or operations from the host system 120 (e.g., read and write commands) and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a power manager 113 that can manage the allocation of power tokens between a set of memory dice in the memory subsystem 110. In some embodiments, the controller 115 includes at least a portion of the power manager 113. For example, the controller 115 can include a processor 117 (processing device) configured to execute instructions stored in local memory 119 for performing the operations described herein. In some embodiments, the power manager 113 is part of the host system 110, an application, or an operating system. In some embodiments, the memory subsystem 110 includes a single power manager 113 (e.g., the power manager 1130). However, in other embodiments, the memory subsystem 110 can include multiple power managers 113 that can manage the allocation of power tokens. For example, the memory devices 130/140 (1) can be distributed across a set of memory dice or (2) can each represent a memory die in a set of memory dice. In either of these configurations, a separate power manager 113 (e.g., one or more of the power managers 113A-113N, which are each integrated within corresponding memory devices 130/140) can be integrated within each memory die or be otherwise associated with each memory die to separately manage the allocation of power tokens, as will be described herein. In some embodiments, the memory devices 130/140 can be managed memory devices (e.g., managed NAND), which is a raw memory device combined with a local controller for memory management within the same memory device package. For example, power managers 113A-113N can be implemented by local controllers within the memory devices 130/140.

The one or more power managers 113 of the memory subsystem 110 can manage the allocation of power tokens between a set of memory dice in the memory subsystem 110. Further details with regards to the operations of the power manager 113 are described below.

As shown in FIG. 1, a memory die configurator 121 can be in communication or otherwise coupled with the memory subsystem 110. In particular, during manufacture of the memory subsystem 113, the memory die configurator 121 can configure the memory subsystem 110, including one or more power managers 113 within the memory subsystem 110, according to the techniques described herein. In one embodiment, the memory die configurator 121 is a part of the host system 120. Although shown as separate from the memory subsystem 110, in some embodiments, the memory die configurator 121 can be integrated within the memory subsystem 110.

Figure 2:
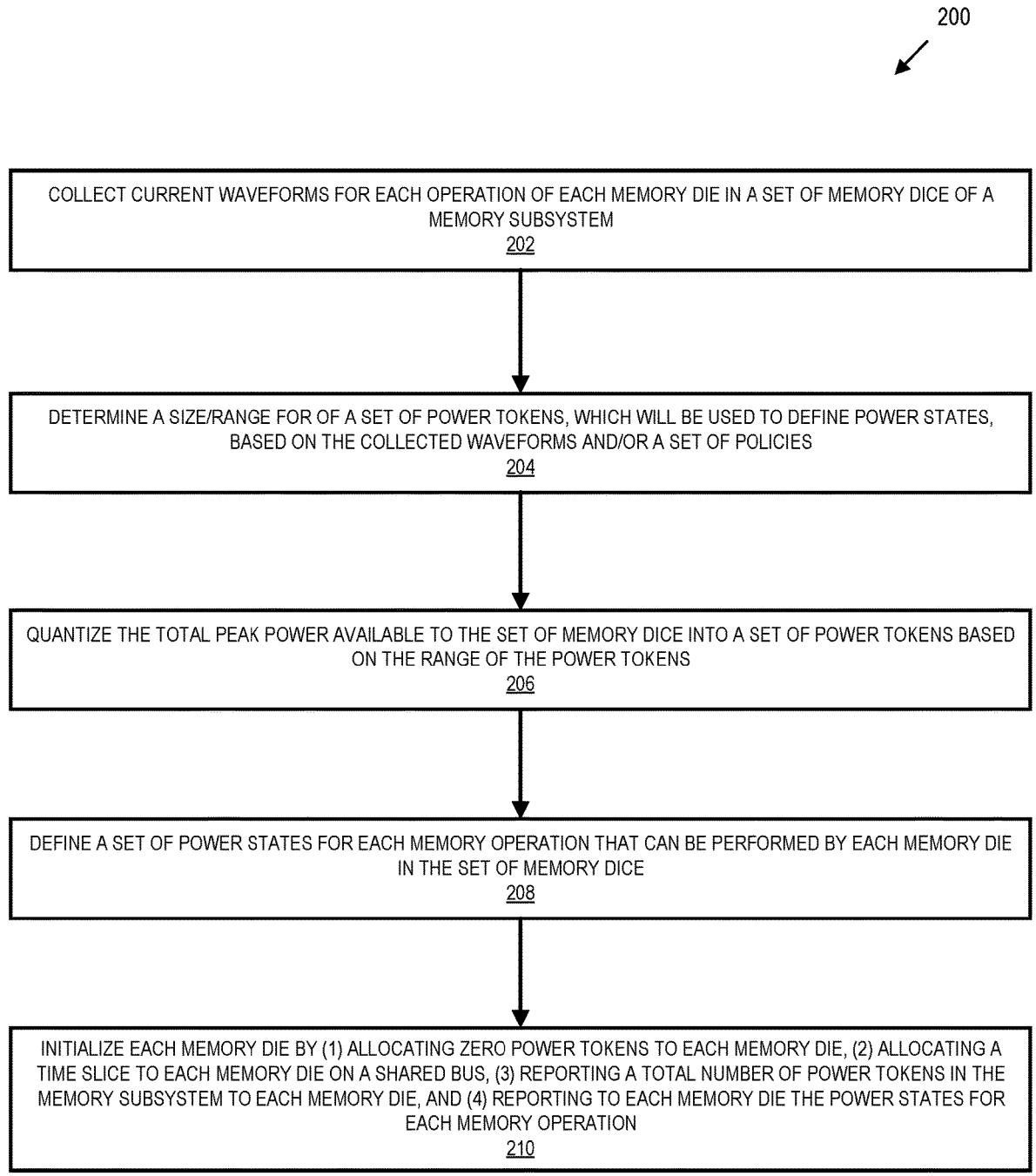
FIG. 2 is a flow diagram of an example method to configure power states of memory dice, in accordance with some embodiments of the present disclosure.

FIG. 2 is a flow diagram of an example method 200 to configure power states of memory dice, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the memory die configurator 121 of FIG. 1. In one embodiment, the method 200 is performed during initial configuration and/or manufacture of the memory subsystem 110. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 202, the processing device collects power waveforms (sometimes referred to as current waveforms) for each memory die in a set of memory dice managed or configured by the processing device. The power waveforms indicate the power and/or electrical current used by each respective memory die for each memory operation in a set of memory operations that can be performed by the memory die. Accordingly, the current waveforms indicate the power consumed by the memory dice over time during the performance of respective memory operations (sometimes referred to as memory algorithms). For example, during performance of a write memory operation, a waveform could indicate that a particular memory die consumes 20 milliamperes (mA) at time T0, 50 mA at time T1, and 25 mA at time T2.

At operation 204, the processing device determines a size/range for a set of power tokens that will be used for defining power states based on the collected power waveforms. As will be described in greater detail below, each memory die will selectively transition between power states, which are defined by the equally sized power tokens (e.g., a first power state corresponds to one power token, a second power state corresponds to two power tokens, etc.), based on the needs of the memory die.

The processing device can select the size/range of the power tokens based on a set of policies. For example, the power waveforms could indicate that the set of memory dice operate between 25 mA and 300 mA for a set of memory operations and a first policy could seek to reduce the number of power state transitions. When the processing device uses this first policy that seeks to reduce the number of power state transitions, the processing device can select a large range for the power tokens. For instance, in the example above, each power token could represent 150 mA, such that a first power state corresponds to one power token for power consumption between 0 mA and 150 mA and a second power state corresponds to two power tokens for power consumption between 151 mA and 300 mA. In contrast, a second policy could seek the efficient use of allocated power in the memory subsystem 110. For instance, in the example above, each power token could represent 25 mA, such that a first power state corresponds to one power token for power consumption between 0 mA and 25 mA, a second power state corresponds to two power tokens for power consumption between 26 mA and 50 mA, a third power state corresponds to three power tokens for power consumption between 51 mA and 75 mA, etc. Using the first set of power states (i.e., a first power state corresponds to one power token for power consumption between 0 mA and 150 mA and a second power state corresponds to two power tokens for power consumption between 151 mA and 300 mA), each memory die can avoid power transitions as each power state provides a wide range of power and therefore has a greater likelihood of meeting the power requirement needs of many phases of memory operations in comparison to smaller range power states. For example, a memory operation that has a power consumption range of 20 mA to 125 mA, based on different power phases of the memory operation, can be entirely performed by a memory die while in the first power state of the first set of power states that is between 0-150 mA. In contrast, the memory operation that has the power consumption range of 20 mA to 125 mA could be entirely performed in a single power state in the second set of power states with 25 mA range power tokens (e.g., a power state with five or more 25 mA power tokens), but this would lead to power token waste/inefficiency during some periods (e.g., when only 20 mA is required by the memory operation). Accordingly, performance of the memory operation using the second set of power states with small range power tokens will require at least one power state transition but will likely efficiently utilize assigned power as each power state defines a narrow power range. Thus, as described above, the processing device can determine a range for a set of power tokens not only based on power waveforms of the set of memory dice, but also based on a set of policies.

At operation 206, the processing device quantizes the total peak power available to the set of memory dice into a set of power tokens based on the range of the power tokens determined at operation 204. In particular, the memory subsystem 110 receives power/current from a power source (e.g., a battery) and the power source has a maximum available power/current (i.e., a peak power). In one embodiment, the processing device looks up or otherwise determines the peak power value and divides that value by the determined size of a power token. For example, if the total peak power available to the set of memory dice is 775 mA and the processing device selects 25 mA power tokens, the processing device determines that a set of thirty-one power tokens (e.g. 775 mA/25 mA=31) are available in the memory subsystem 110 for the set of memory dice. In this example, each power token represents 25 mA from the peak power available to the set of memory dice.

Although described in relation to a peak power provided to the memory subsystem 110, in some embodiments, the processing device can perform quantization of a lower power level than the peak power provided to the memory subsystem 110. For example, although a power source provides the memory subsystem with a peak power of 775 mA, the processing device can determine that the memory subsystem 110 is to operate in a low power or reduced power state, which is relative to the peak power provided to the memory subsystem 110. For instance, the processing device can determine that the memory subsystem 110 is to operate at 500 mA to conserve power. Accordingly, the processing device quantizes this lower power level at operation 206 into a set of power tokens based on the range of the power tokens determined at operation 204.

At operation 208, the processing device defines a set of power states for each memory operation that can be performed by each memory die in the memory subsystem 110. For example, FIG. 3 shows a set of power states $304A_0$-$304A_3$ for the memory operation 302A and a set of power states $304B_0$-$304B_2$ for the memory operation 302B. As shown, each power state 304 includes a time period 306 (sometimes referred to as a width 306) and a number of power tokens 308. For instance, the power state $304A_0$ for the memory operation 302A has a time period 306 of three microseconds and four power tokens 308, the power state $304A_1$ has a time period 306 of five microseconds and two power tokens 308, the power state $304A_2$ has a time period 306 of two microseconds and one power token 308, and the power state $304A_3$ has a time period 306 of one microsecond and four power tokens 308. In contrast, the power state $304B_0$ for the memory operation 302B has a time period 306 of six microseconds and three power tokens 308, the power state $304B_1$ has a time period 306 of two microseconds and two power tokens 308, and the power state $304B_2$ has a time period 306 of six microseconds and one power token 308. In this configuration, each memory operation 302 is an algorithm with a set of sub-operations or phases, which require different amounts of power to complete, and the power states 304 correspond to the power requirements at each phase of the memory operation 302. In one embodiment, the processing device determines the power states 304 for each operation 302 based on the waveforms for each operation 302 that can be performed by each memory die, which were collected at operation 202. For example, the processing device divides each waveform of a memory operation 302 into a set of time periods. For instance, the processing device can divide the waveforms based on (1) a predefined time interval or (2) local peaks or troughs in the waveforms. For each time period of a waveform, the processing device determines a peak power consumption requirement and selects a power state 304 with a number of power tokens 308 that satisfies this peak power consumption requirement.

In some embodiments, the processing device determines power states 304 for each memory operation 302 based on a set of policies that define different granularities. For example, a first policy could seek to divide each memory operation 302 into a greater number of power states 304 than a second policy (e.g., the processing device splits each waveform into shorter time periods for the first policy than the second policy). For instance, in response to the first policy, the processing device could split the memory operation 302A into ten power states 304A, whereas, in response to the second policy, the processing device could split the memory operation 302A into four power states 304A (as shown in FIG. 3). When a greater number of power states 304 are utilized for a memory operation 302, greater efficiency of power tokens 308 is ensured (i.e., a greater control over power consumption) in comparison to when a lesser number of power states 304 are utilized. However, this efficiency in power token 308 usage is at the sake of a potentially larger number of power state 304 transitions (i.e., more power management is potentially required).

Figure 4:
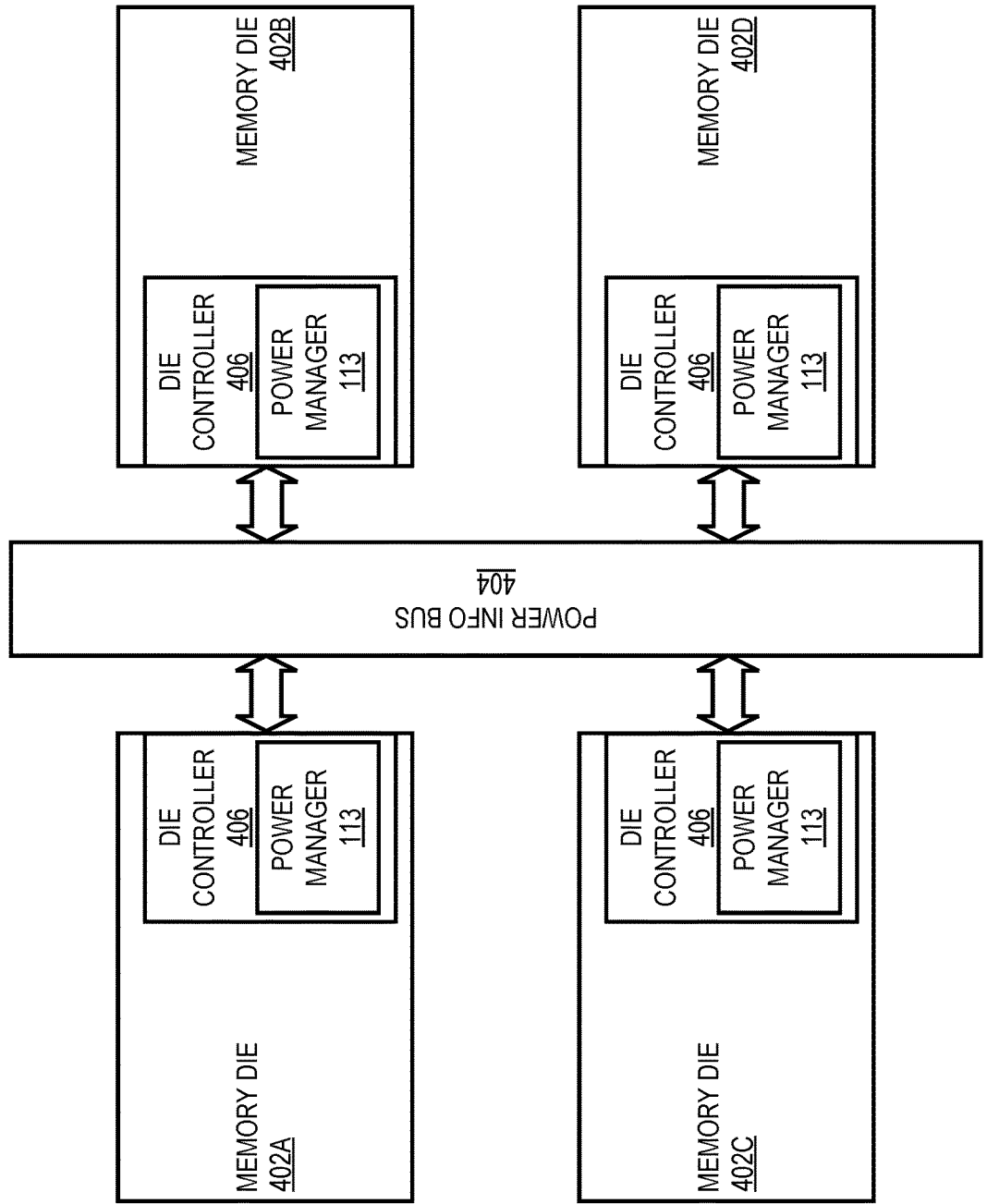
FIG. 4 shows an example configuration of a set of four memory die with a shared bus, in accordance with some embodiments of the present disclosure.

At operation 210, the processing device initializes each memory die in the memory subsystem 110 by (1) allocating zero power tokens 308 to each memory die, (2) assigning a time slice on a shared memory bus to each memory die, (3) reporting to each memory die a total number of power tokens available to the set of memory dice (e.g., thirty-one tokens in the example provided above), and (4) reporting to each memory die the power states 304 for each memory operation 302. FIG. 4 shows an example configuration of a set of four memory dice 402A-402D with a shared bus 404 (sometimes referred to as the power information bus 404), which is separate from a data bus fulfilling memory operations 302. As shown in FIG. 4, each memory die 402 includes a die controller 406, which includes a power manager 113. As described above, each memory die 402 is assigned a separate time slice on the shared bus 404. For example, the memory dice 402 can share a clock signal associated with the shared bus 404. In this configuration, the processing device assigns time on the shared bus 404 into four time slices (sometimes referred to as time intervals) with the processing device assigning the memory die 404A the first time slice, the processing device assigning the memory die 404B the second time slice, the processing device assigning the memory die 404C the third time slice, and the processing device assigning the memory die 404D the fourth time slice. In this example, for a set of eight clock signals on the shared bus 404, the first time slice corresponds to the first and fifth clock signals, the second time slice corresponds to the second and sixth clock signals, the third time slice corresponds to the third and seventh clock signals, and the fourth time slice corresponds to the fourth and eighth clock signals. As will be described herein, during each respective time slice, the power manager 113 of the corresponding memory die 402 can report/broadcast on the shared bus 404 their current power token 308 allocation in the memory subsystem 110. In this fashion, by reading power token messages broadcast on the shared bus 404, each memory die 402 can (1) track power token 308 allocation for each memory die 402, (2) track total allocated and free power tokens 308 in the memory subsystem 110 (i.e., the difference between the total power tokens 308 in the memory subsystem 110 and power token 308 allocations to the memory dice 402 as reported on the shared bus 404), (3) request additional power token 308 allocation when available in the memory subsystem 110 and needed by a corresponding memory die 402, and (4) release power tokens 308 when they are unneeded by a corresponding memory die 402.

In some embodiments, the processing device can perform the method 200 for separate power domains. For example, multiple power sources can provide the memory subsystem 110 power (e.g., separate batteries are separate power rails). In this example, the processing device performs the method 200 in relation to each power source such that power tokens are determined for each power source.

As described above, the processing device can perform the method 200 during initial configuration and/or manufacture of the memory subsystem 110. In some cases, the processing device can perform the method 200 periodically to reconfigure performance of the memory subsystem 110.

Figure 5:
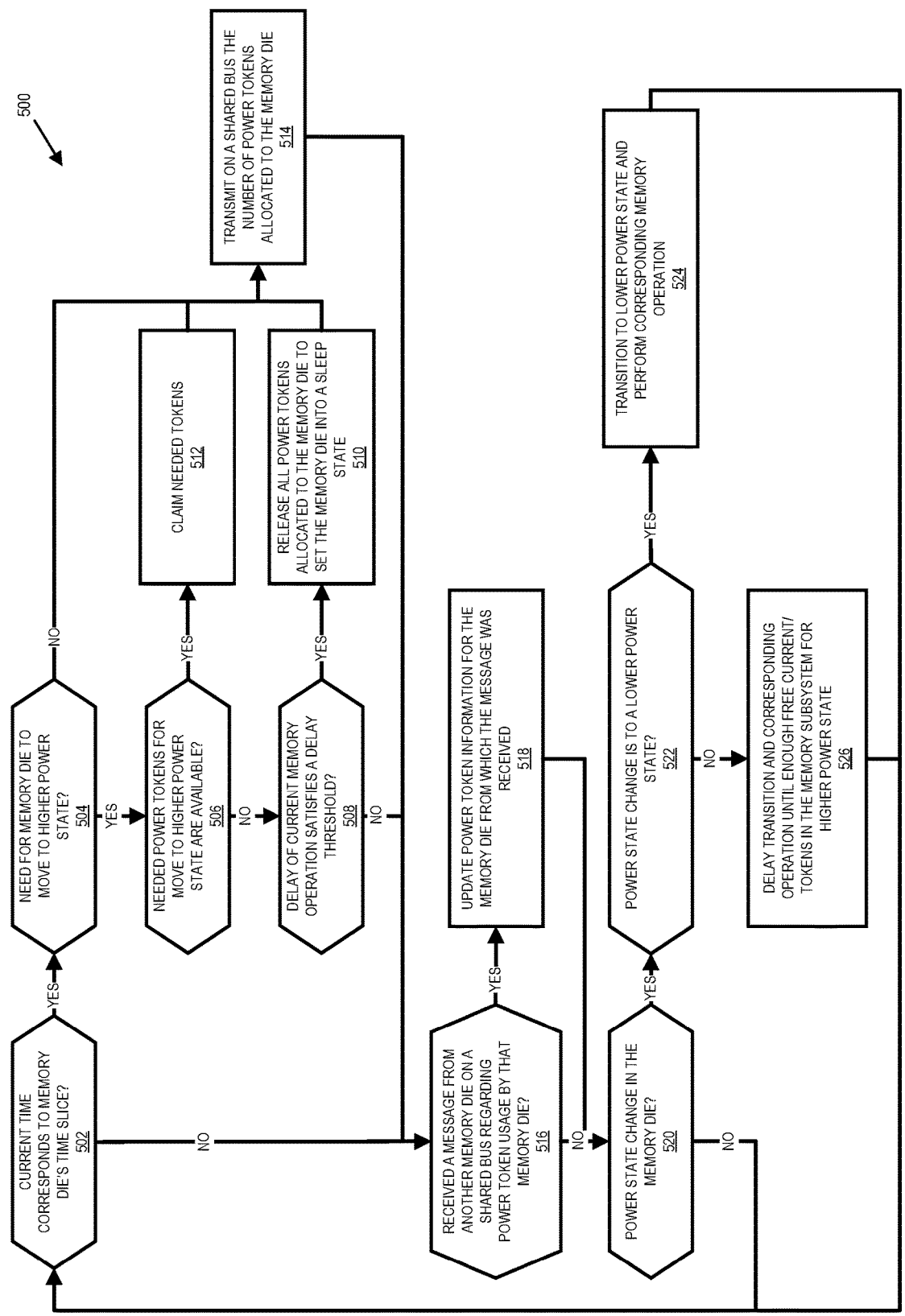
FIG. 5 is a flow diagram of an example method to manage power states of memory dice, in accordance with some embodiments of the present disclosure.

Turning now to FIG. 5, a flow diagram will be described for an example method 500 to manage power states of memory dice, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the power manager(s) 113 of FIG. 1 and/or FIG. 4. In one embodiment, the method 500 is performed by each memory die 402 after initial configuration and/or manufacturer of the memory subsystem 110

(e.g., as represented in FIG. 2). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Although the method 500 will be described below in relation to the memory die 402A, each memory die 402B-402D can perform the method 500 concurrently in a similar fashion. Accordingly, the description below of the method 500 is illustrative instead of limiting in relation to a single memory die 402.

At operation 502, the processing device determines if the current time corresponds to a time slice of the memory die 402A. As noted above in relation to the method 200, each memory die 402A-402D is assigned a separate time slice on the shared bus 404. As will be described in greater detail below, during the time slice assigned to the memory die 402A, the memory die 402A can transmit a current power token 308 allocation of the memory die 402A on the shared bus 404 such that other memory dice 402B-402D can track power token 308 allocation in the memory subsystem 110. When the processing device determines that the current time corresponds to the time slice of the memory die 402A, the method 500 moves to operation 504.

At operation 504, the processing device determines whether the memory die 402A needs to move to a higher power state 304. In particular, the memory die 402A can perform a set of memory operations 302 (e.g., a read/sense memory operation, a write/program memory operation, and an erase memory operation) and each memory operation 302 can be associated with a set of power states 304. For example, as described above, FIG. 3 shows a set of power states 304 that are associated with memory operations 302A and 302B and correspond to different phases of performance of the memory operations 302A and 302B, respectively. In this example, the memory die 402A is performing the memory operation 302A and is currently operating in power state $304A_2$, which corresponds to one power token 308. Upon the processing device determining that the memory die 402A is moving from the power state $304A_2$ to the higher power state $304A_3$, which corresponds to four power tokens 308 (e.g., the processing device determines that the memory die 402A is moving from the power state $304A_2$ to the higher power state $304A_3$ based on the elapse of the time period 306 of two microseconds corresponding to the power state $304A_2$), the method 500 moves to operation 506.

At operation 506, the processing device determines if the power tokens 308 needed by the memory die 402A to move to the higher power state 304 are available in the memory subsystem 110. For instance, in the example above in which the memory die 402A is moving from the power state $304A_2$ to the power state $304A_3$, an additional three power tokens are needed to meet the difference between the one power token 308 already allocated to the memory die 402A for the power state $304A_2$ and the four power tokens needed for the power state $304A_3$. In one embodiment, the processing device determines whether enough power tokens 308 are available for the transition from the lower power state 304 to the higher power state 304 based on a table maintained by the memory die 402A, which tracks power token 308 allocation to each memory die 402 (e.g., the memory dice 402A-402D).

For example, FIG. 6 shows a power token tracking table 600 that is maintained by the memory die 402A. Similar power token tracking tables can be maintained by each of the memory dice 402B-402D. As shown in FIG. 6, the power token tracking table 600 includes (1) a memory die identifier field 602 that indicates an identifier for each of the memory dice 402A-402D (i.e., the identifier "A" corresponds to the memory die 402A, the identifier "B" corresponds to the memory die 402B, the identifier "C" corresponds to the memory die 402C, and the identifier "D" corresponds to the memory die 402D); (2) a number of power tokens field 604 that indicates a number of power tokens 308 allocated to each respective memory die 402A-402D, and (3) a time slice field 606 that indicates a time slice associated with each respective memory die 402A-402D (i.e., the memory die 402A is allocated the first time slice, the memory die 402B is allocated the second time slice, the memory die 402C is allocated the third time slice, and the memory die 402D is allocated the fourth time slice). Based on the power token tracking table 600, thirty power tokens 308 of the total thirty-one power tokens 308 in the memory subsystem 110 are already allocated to memory dice 402. Accordingly, only one additional power token 308 is available for the memory die 402A. Since, in the example presented above, the memory die 402A requires three additional power tokens 308 and only one is available, the processing device determines at operation 506 that not enough power tokens 308 needed by the memory die 408 to move to the higher power state 304 are available in the memory subsystem 110, and moves to operation 508.

At operation 508, the processing device determines whether the delay of the current memory operation 302 to be performed by the memory die 402A satisfies (e.g., is above or equal to) a delay threshold. Namely, since at operation 506 the processing device determined that there were not enough power tokens 308 available in the memory subsystem 110 to move to a higher power state 304, the memory die 402A cannot transition to the higher power state 304 and performance and/or completion of the memory operation 302 is delayed. For example, the processing device can delay performance of the memory operation 302 until the memory die's 402A next time slice.

When the processing device determines that the delay of the memory operation 302 satisfies a delay threshold, the method 500 moves to operation 510 for the processing device to release/deallocate all power tokens 308 allocated to the memory die 402A and set the memory die 402A into a sleep state. In particular, the processing device can update an entry in the power token tracking table 600 corresponding to the memory die 402A to indicate zero allocated power tokens 308 and report this new allocation, as will be described. This release/deallocation of power tokens 308 prevents a stalemate condition in which all the memory dice 402 are attempting to move to a higher power state 304 but not enough power tokens 308 are available. By releasing allocated power tokens 308 after a delay threshold has been exceeded, the processing device sacrifices performance of the memory die 402A in favor of prevention of a stalemate condition across all of the memory dice 402A-402D in the memory subsystem 110.

Returning to operation 506, in response to the processing device determining that enough power tokens 308 needed by the memory die 402A to move to the higher power state 304 are available in the memory subsystem 110, the method 500 moves to operation 512 to claim the needed power tokens 308. In particular, the processing device can update an entry in the power token tracking table 600 corresponding to the memory die 402A to indicate a new number of allocated power tokens 308. For example, FIG. 7 shows a power token tracking table 600 in which twenty-five power tokens 308 in the memory subsystem 110 are already allocated to memory dice 402A-402D. Accordingly, six power tokens 308 are available for the memory die 402A from the thirty-one power tokens 308 in the memory subsystem 110. Since, in the example presented above, the memory die 402A requires three additional power tokens 308 and six power tokens 308 are available, the processing device determines at operation 506 that enough power tokens 308 needed by the memory die 402A to move to the higher power state 304 are available in the memory subsystem 110 and moves to operation 512. At operation 512, the processing device updates the power token tracking table 600 to indicate that four power tokens 308 are allocated to the memory die 402A, as shown in FIG. 8.

Following (1) the processing device determining at operation 504 that the memory die 402A needs to move to a lower power state 304 (e.g., the memory die 402A is in power state $304A_0$ and needs to move to power state $304A_1$) or does not need to change power state 304, (2) the processing device claiming needed power tokens 308 for the memory die 402A at operation 512, or (3) the processing device releasing all power tokens 308 assigned to the memory die 402A at operation 510, the method 500 moves to operation 514. At operation 514, the processing device transmits on the shared bus 404 the number of power tokens 308 allocated to the memory die 402A. In particular, as noted above, since the current time corresponds to the time slice of the memory die 402A on the shared bus 404, the processing device transmits a message on the shared bus 404 that includes the number of power tokens 308 allocated to the memory die 402A. This transmission could indicate (1) the same power token 308 allocation as a previous transmission (e.g., no power state 304 change for the memory die 402A), (2) a reduced power token 308 allocation in comparison to a previous transmission (e.g., the memory die 402A moves to a lower power state 304, including potentially releasing all power tokens 304 to avoid a deadlock/stalemate in the memory subsystem 110), or (3) a greater power token 308 allocation in comparison to a previous transmission (e.g., the memory die 402A moves to a higher power state 304). As will be described below, this transmission can be used by other memory dice 402 to update corresponding power token tracking tables 600 to track power token 308 allocation within the memory subsystem 110.

Following (1) the processing device determining at operation 502 that the current time does not correspond to a time slice allocated to the memory die 402A, (2) the processing device determining at operation 508 that the delay of the current memory operation 302 to be performed by the memory die 402A is below a delay threshold, or (3) the processing device transmitting a number of power tokens 308 allocated to the memory die 402A on the shared bus 404 at operation 514, the method 500 moves to operation 516.

At operation 516, the processing device determines whether a message/transmission has been received on the shared bus 404 corresponding to another memory die 402B-402D in the memory subsystem 110. As described above in relation to operation 514, each memory die 402 can transmit their power token 308 allocation on the shared bus 404 during an assigned time slice. Accordingly, the memory die 402A can receive messages on the shared bus 404 during various time slices that are not assigned to the memory die 402A and which indicate the power token 308 allocation of the other memory dice 402B-402D. In response to receipt of a message, the method 500 moves to operation 518.

At operation 518, the processing device updates the power token tracking table 600 for the memory die 402A. Namely, the processing device (1) determines the time slice during which the message was received, (2) determines the memory die 402 to which the determined time slice corresponds (e.g., based on the time slice 606 information provided in the power token tracking table 600), and (3) updates an entry in the power token tracking table 600 corresponding to the determined memory die 402 with the number of power tokens 308 indicated in the received message. Accordingly, the power token tracking table 600 of the memory die 402A maintains an accurate count of power token 308 allocation in the memory subsystem 110. For example, when the processing device receives a message on the shared bus 404 during time slice three, which indicates ten power tokens 308, the processing device updates the third entry in the power token tracking table 600, which corresponds to the memory die 402C with the identifier "C", to indicate ten power tokens 308 are allocated to the memory die 402C.

In some embodiments, a memory die 402 could not transmit any messages during an allocated time slice. In these embodiments, the processing device determines that lack of receipt of a message during a time slice is an indication that no update to power token 308 allocation has been made. Accordingly, in response to the processing device failing to receive a message at operation 516, the method 500 moves to operation 520.

At operation 520, the processing device determines if the memory die 402A can or needs to change power states 304. Namely, as described above, each memory die 402 can perform a set of memory operations 302 and each memory operation 302 can be comprised of a set of phases with associated power states 304. As the memory die 402 performs a memory operation 302, the power requirements to perform the memory operation 302 can vary (e.g., at different phases of the memory operation 302, the memory die 402 needs to change power state 304). Accordingly, the processing device can determine at operation 520 that the memory die 402A can or needs to change its power state 304 based on progression/performance of a memory operation 302 (i.e., progression of a current memory operation 302 or performance of a new memory operation 302). In some embodiments, the processing device determines the change of a power state 304 based on policy considerations. For example, when the memory die 402A completes a memory operation 302 and prior to commencing a new memory operation 302, the processing device can either enforce (1) a fair power token release policy, whereby the processing device determines that the memory die 402A can enter a sleep power state 304 and release power tokens 308 allocated to the memory die 402A or (2) a greedy power token release policy, whereby the processing device determines that the memory die 402A maintains its current power state 304 and not release any power tokens 308 allocated to the memory die 402A while waiting to perform a new memory operation 302. In response to the processing device determining at operation 520 that the memory die 402A is not to change power states 304, the method 500 returns to operation 502 to determine if the current time corresponds to the time slice of the memory die 402A. Conversely, in response to the processing device determining at operation 520 that the memory die 402A is to change power states 304, the method 500 moves to operation 522.

At operation 522, the processing device determines if the change in power state 304 determined at operation 520 is a transition to a lower power state 304 that corresponds to the current allocation of power tokens 308 (i.e., the current allocation of power tokens 308 is greater than the power token 308 allocation of the new power state 304) or if the change in power state 304 determined at operation 520 is a transition to a higher power state 304 that corresponds to the current allocation of power tokens 308 (i.e., the current allocation of power tokens 308 is less than the power token 308 allocation of the new power state 304). In response to determining that the change in power state 304 is to a lower power state 304, the method 500 moves to operation 524.

At operation 524, the processing device causes the memory die 402A to transition to the lower power state 304. Namely, since the new power state 304 requires fewer power tokens 308 than the previous/current power state 304, there is assurance that the memory die 402A has already been allocated enough power tokens 308 to fulfill the new power requirements of the memory operation 302 being performed by the memory die 402A. Accordingly, the memory die 402A can transition to the new power state 304 and deallocate unused/unneeded power tokens 308 when the time slice of the memory die 402A arrives. Following operation 524, the method 500 returns to operation 502.

Returning to operation 522, in response to determining that the change in power state 304 is to a higher power state 304, the method 500 moves to operation 526. In contrast to the transition to a lower power state 304, the memory die 402A does not have enough allocated power tokens 308 to fulfill the new power requirements of the current phase of the memory operation 302 being performed by the memory die 402A. Thus, the memory die 402A must wait for its allocated time slice to request/allocate more power tokens 308. Accordingly, at operation 526, the processing device delays transition to the higher power state 304 and further performance of the memory operation 302 until the memory die 402A has been allocated enough additional power tokens 308 to fulfill the requirements of the new power state 304. Following operation 522, the method 500 returns to operation 502.

Figure 9:
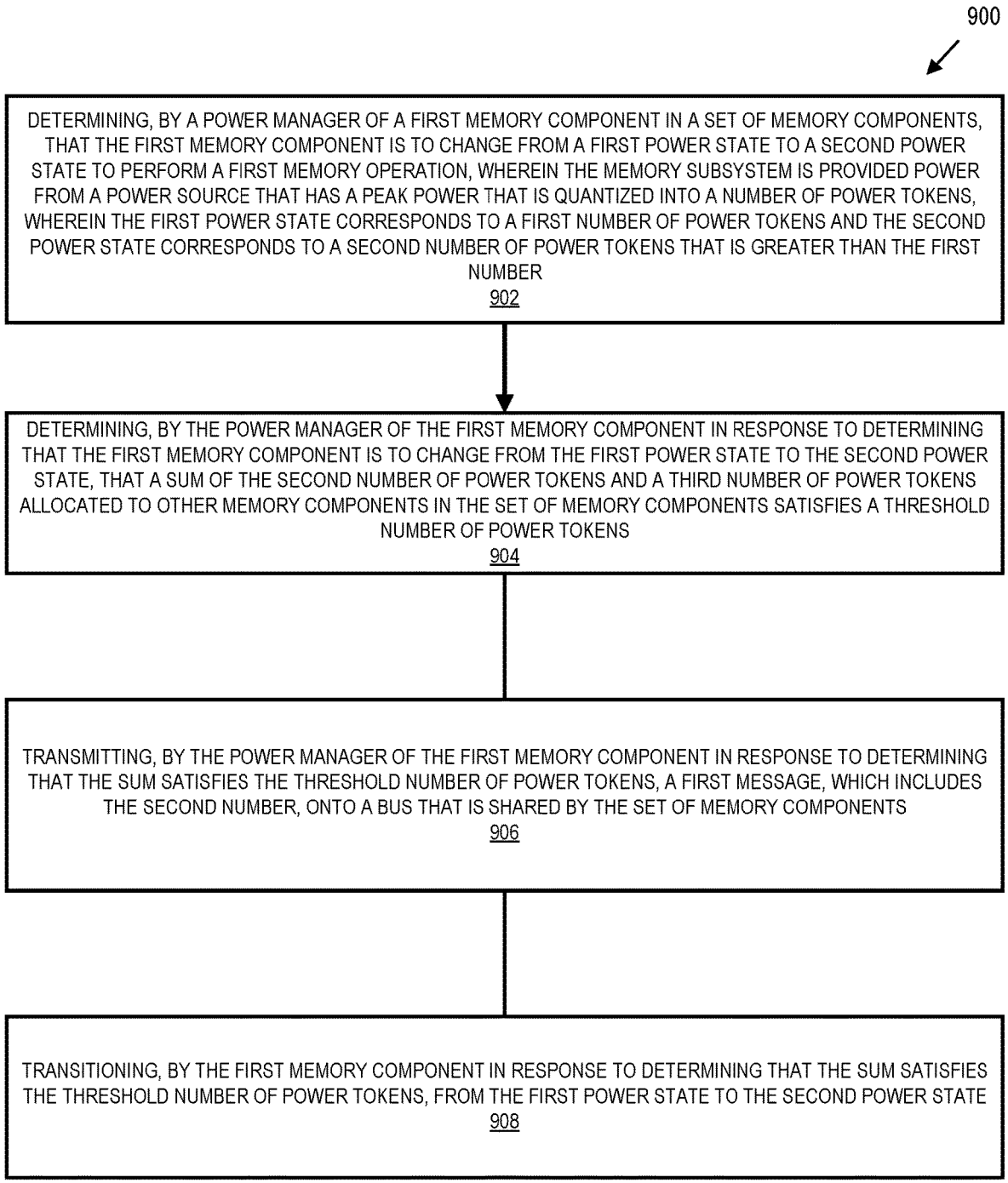
FIG. 9 is a flow diagram of another example method to manage power states of memory dice, in accordance with some embodiments of the present disclosure.

Turning now to FIG. 9, a flow diagram will be described for another example method 900 to manage power states of memory devices (e.g., the memory dice 402), in accordance with some embodiments of the present disclosure. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the power manager(s) 113 of FIG. 1 and/or FIG. 4. In one embodiment, the method 900 is performed by each memory die 402 after initial configuration and/or manufacturer of the memory subsystem 110, which was represented in FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 902, the processing device determines that a memory device (e.g., a memory die 402) is to change from a first power state 304 to a second power state 304 to perform a memory operation 302. For example, the processing device determines that the memory die 402A is to move from the first power state $304A_2$ to the second power state $304A_3$ to continue performing the operation 302A. As described herein, the memory subsystem 110, in which the memory die 402A is installed, is provided power from a power source that has a peak power that is quantized into a set number of power tokens 308. Further, in the example above, the first power state $304A_2$ corresponds to a first number of power tokens 308 (e.g., one power token 308) and the second power state $304A_3$ corresponds to a second number of power tokens 308 (e.g., four power tokens 308) that is greater than the first number.

At operation 904, the processing device determines, in response to determining that the memory device (e.g., the memory die 402A) is to change from the first power state $304A_2$ to the second power state $304A_3$, whether the sum of the second number of power tokens 308 and a third number of power tokens 308 allocated to other memory devices in the set of memory devices (e.g., the set of memory dice 402A-402D), satisfies a threshold number of power tokens 308. For example, when the total number of power tokens 308 available to the set of memory dice 402A-402D is thirty-one, the processing device determines if the sum of the four power tokens 308 needed for the second power state $304A_3$ and the total number of power tokens 308 already allocated to the power dice 402B-402D is greater than thirty-one.

At operation 906, the processing device transmits, in response to determining that the sum satisfies the threshold number of power tokens 308, a message. For example, the message includes the second number (e.g., the message includes or otherwise indicates the four power tokens 308 needed for the second power state $304A_3$) and is transmitted on a bus 404 that is shared by the set of memory dice 402A-402D. In this configuration, the transmitting of the message is performed indicates that the memory die 402A is claiming/allocating the four power tokens 308 for itself.

At operation 908, the processing device transitions the memory device from the first power state $304A_2$ to the second power state $304A_3$, in response to determining that the sum satisfies the threshold number of power tokens.

Figure 10:
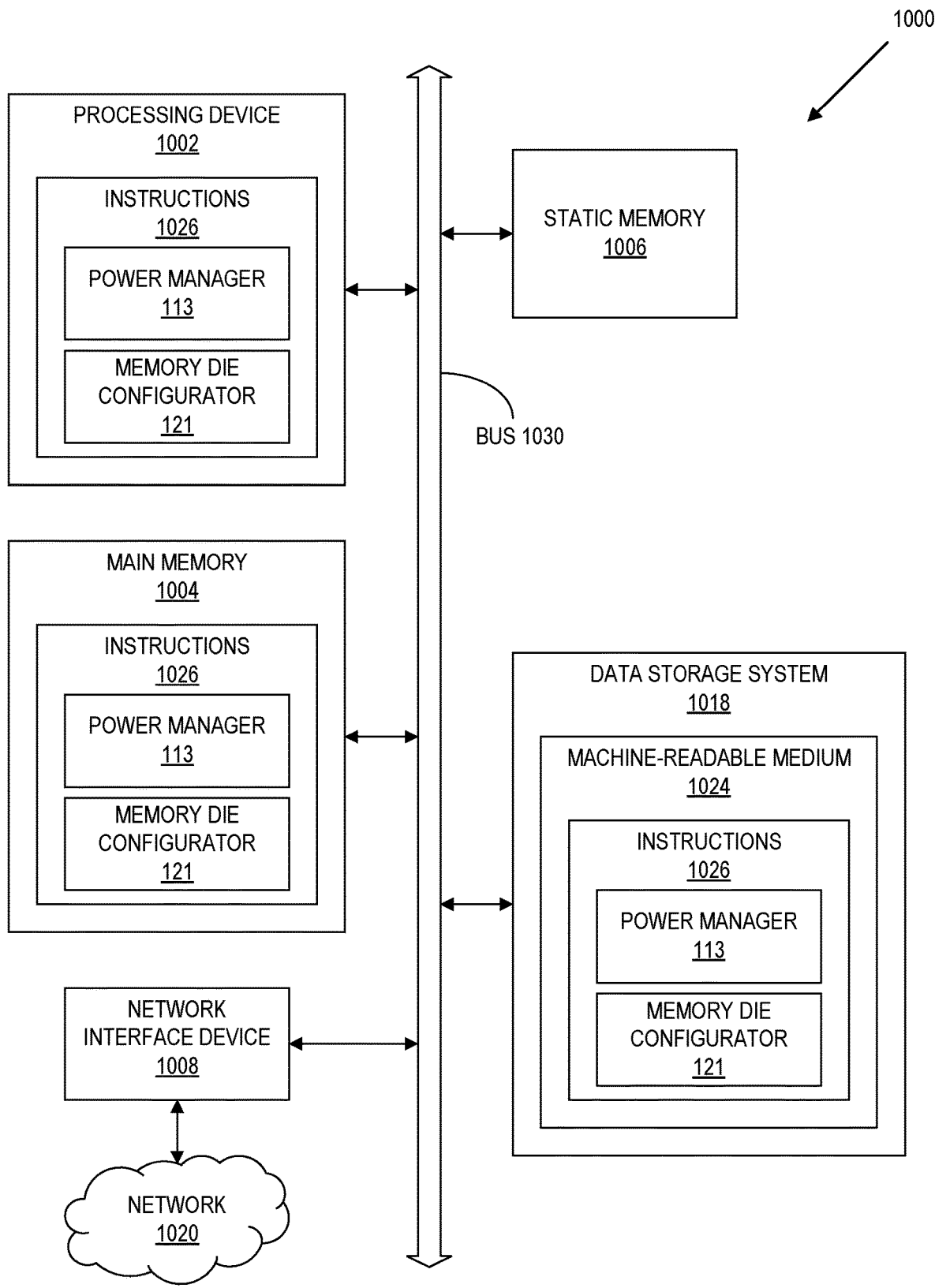
FIG. 10 is a block diagram of an example computer system in which embodiments of the present disclosure may operate.

FIG. 10 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the power manager 113 and/or the memory die configurator 121 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1018, and/or main memory 1004 can correspond to the memory subsystem 110 of FIG. 1.

In one embodiment, the instructions 1026 include instructions to implement functionality corresponding to a power manager and/or a memory die configurator (e.g., the power manager 113 and/or the memory die configurator 121 of FIG. 1). While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115 and/or the memory die configurator 121, may carry out the computer-implemented methods 200 and 500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method for managing power amongst a set of memory devices in a memory subsystem, the method comprising:
   determining, by a power manager of a first memory device in the set of memory devices, that the first memory device is to change from a first power state to a second power state to perform a first memory operation, wherein the memory subsystem is provided power from a power source that has a peak power that is quantized into a number of power tokens, wherein the first power state corresponds to a first number of power tokens and the second power state corresponds to a second number of power tokens that is greater than the first number;
   determining, by the power manager of the first memory device in response to determining that the first memory device is to change from the first power state to the second power state, that a sum of the second number of power tokens and a third number of power tokens allocated to other memory devices in the set of memory devices satisfies a threshold number of power tokens;
   transmitting, by the power manager of the first memory device during a time slice assigned to the first memory device and in response to determining that the sum satisfies the threshold number of power tokens, a first message, which includes the second number, onto a bus that is shared by the set of memory devices; and
   transitioning, by the first memory device in response to determining that the sum satisfies the threshold number of power tokens, from the first power state to the second power state.

2. The method of claim 1, wherein the method further comprises:
   determining, by the power manager of the first memory device, that a current time corresponds to the time slice assigned to the first memory device,
   wherein determining that the first memory device is to change from the first power state to the second power state is performed in response to determining that the current time corresponds to the time slice assigned to the first memory device.

3. The method of claim 1, further comprising:
   detecting, by the power manager of the first memory device, a second message from a second memory device in the set of memory devices, wherein the second message indicates a number of power tokens allocated to the second memory device; and
   recording, by the power manager of the first memory device in response to detecting the second message, the number of power tokens allocated to the second memory device.

4. The method of claim 1, further comprising:
   determining, by the power manager of the first memory device, that the first memory device is to change from the second power state to a third power state to perform a second memory operation, wherein the third power state corresponds to a fourth number of power tokens that is less than the second number of power tokens; and
   transitioning, by the first memory device in response to determining that the third number of power tokens is less than the second number of power tokens, from the second power state to the third power state.

5. The method of claim 4, further comprising:
   transmitting, by the power manager of the first memory device, a third message with the fourth number onto the bus that is shared by the set of memory devices during the time slice assigned to the first memory device.

6. The method of claim 1, wherein each power token corresponds to an equal amount of power of the peak power.

7. The method of claim 1, wherein the number of power tokens is set based on (1) power waveforms for each memory operation in a set of memory operations, which indicate power requirements of the set of memory devices during performance of the set of memory operations and (2) a set of policies, comprising:
   a first policy that reduces transitions between power states by the set of memory devices by increasing an amount of power represented by each power token in the number of power tokens from the peak power; or
   a second policy that increases an efficiency of allocated power used by the set of memory devices by reducing the amount of power represented by each power token.

8. A memory subsystem comprising:
   a plurality of memory devices; and
   a processing device, operatively coupled with the plurality of memory devices, to:
      determine that a first memory device from the plurality of memory devices is to change from a first power state to a second power state to perform a first memory operation, wherein the memory subsystem is provided power from a power source that has a peak power that is quantized into a number of power tokens, wherein the first power state corresponds to a first number of power tokens and the second power state corresponds to a second number of power tokens;
      determine, in response to determining that the first memory device is to change from the first power state to the second power state, whether the second number is larger than the first number;
      determine, in response to determining that the second number is larger than the first number, that a sum of the second number of power tokens and a third number of power tokens allocated to other memory devices in the plurality of memory devices satisfies a threshold number of power tokens;
      transmit, during a time slice assigned to the first memory device and in response to determining that the sum satisfies the threshold number of power tokens, a first message, which includes the second number, onto a bus that is shared by the plurality of memory devices; and
      transition, in response to determining that the sum satisfies the threshold number of power tokens, from the first power state to the second power state.

9. The memory subsystem of claim 8, wherein the processing device is further to:
   determine that a current time corresponds to the time slice assigned to the first memory device,
   wherein determining that the first memory device is to change from the first power state to the second power state is performed in response to determining that the current time corresponds to the time slice assigned to the first memory device.

10. The memory subsystem of claim 8, wherein the processing device is further to:
    detect a second message from a second memory device in the plurality of memory devices, wherein the second message indicates a number of power tokens allocated to the second memory device; and record, in response to detecting the second message, the number of power tokens allocated to the second memory device.

11. The memory subsystem of claim 8, wherein the processing device is further to:

determine that the first memory device is to change from the second power state to a third power state to perform a second memory operation, wherein the third power state corresponds to a fourth number of power tokens that is less than the second number of power tokens; and transition, by the first memory device in response to determining that the third number of power tokens is less than the second number of power tokens, from the second power state to the third power state.

12. The memory subsystem of claim 11, wherein the processing device is further to:

transmit a third message with the fourth number onto the bus that is shared by the plurality of memory devices during the time slice assigned to the first memory device.

13. The memory subsystem of claim 8, wherein each power token corresponds to an equal amount of power of the peak power.

14. The memory subsystem of claim 8, wherein the number of power tokens is set based on (1) power waveforms for each memory operation in a set of memory operations, which indicate power requirements of the plurality of memory devices during performance of the set of memory operations and (2) a set of policies, comprising:

a first policy that reduces transitions between power states by the plurality of memory devices by increasing an amount of power represented by each power token in the number of power tokens from the peak power; or a second policy that increases an efficiency of allocated power used by the plurality of memory devices by reducing the amount of power represented by each power token.

15. A non-transitory computer-readable storage medium comprising instructions that, when executed by a processing device, cause the processing device to:

determine that a first memory device in a set of memory devices of a memory subsystem is to change from a first power state to a second power state to perform a first memory operation, wherein the memory subsystem is provided power from a power source that has a peak power that is quantized into a number of power tokens, wherein the first power state corresponds to a first number of power tokens and the second power state corresponds to a second number of power tokens that is greater than the first number;

determine, in response to determining that the first memory device is to change from the first power state to the second power state, that a sum of the second number of power tokens and a third number of power tokens allocated to other memory devices in the set of memory devices satisfies a threshold number of power tokens;

transmit, during a time slice assigned to the first memory device and in response to determining that the sum satisfies the threshold number of power tokens, a first message, which includes the second number, onto a bus that is shared by the set of memory devices; and transition, by the first memory device in response to determining that the sum satisfies the threshold number of power tokens, from the first power state to the second power state.

16. The non-transitory computer-readable medium of claim 15, wherein the processing device is further to:

determine that a current time corresponds to the time slice assigned to the first memory device, wherein determining that the first memory device is to change from the first power state to the second power state is performed in response to determining that the current time corresponds to the time slice assigned to the first memory device.

17. The non-transitory computer-readable medium of claim 15, wherein the processing device is further to:

detect a second message from a second memory device in the set of memory devices, wherein the second message indicates a number of power tokens allocated to the second memory device; and record, in response to detecting the second message, the number of power tokens allocated to the second memory device.

18. The non-transitory computer-readable medium of claim 15, wherein the processing device is further to:

determine that the first memory device is to change from the second power state to a third power state to perform a second memory operation, wherein the third power state corresponds to a fourth number of power tokens that is less than the second number of power tokens; and transition, in response to determining that the third number of power tokens is less than the second number of power tokens, from the second power state to the third power state.

19. The non-transitory computer-readable medium of claim 18, wherein the processing device is further to:

transmit a third message with the fourth number onto the bus that is shared by the set of memory devices during the time slice assigned to the first memory die.

20. The non-transitory computer-readable medium of claim 15, wherein the number of power tokens is set based on (1) power waveforms for each memory operation in a set of memory operations, which indicate power requirements of the set of memory devices during performance of the set of memory operations and (2) a set of policies, comprising:

a first policy that reduces transitions between power states by the set of memory devices by increasing an amount of power represented by each power token in the number of power tokens from the peak power; or a second policy that increases an efficiency of allocated power used by the set of memory devices by reducing the amount of power represented by each power token.

* * * * *